(12) United States Patent
Erbe et al.

(10) Patent No.: US 10,188,018 B2
(45) Date of Patent: Jan. 22, 2019

(54) DEVICE FOR CONTROLLING PERSONAL PROTECTION MEANS AND METHOD FOR PRODUCING A DEVICE FOR CONTROLLING PERSONAL PROTECTION MEANS

(71) Applicant: Robert Bosch GmbH, Stuttgart (DE)

(72) Inventors: Christian Erbe, Yongin-Si (KR); Rainer Gschwind-Schilling, Rutesheim (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 15/320,627

(22) PCT Filed: May 8, 2015

(86) PCT No.: PCT/EP2015/060174
§ 371 (c)(1),
(2) Date: Feb. 24, 2017

(87) PCT Pub. No.: WO2015/197247
PCT Pub. Date: Dec. 30, 2015

(65) Prior Publication Data
US 2017/0257986 A1    Sep. 7, 2017

(30) Foreign Application Priority Data

Jun. 25, 2014   (DE) .................. 10 2014 212 243

(51) Int. Cl.
*H05K 9/00* (2006.01)
*H05K 5/00* (2006.01)
(Continued)

(52) U.S. Cl.
CPC .......... *H05K 9/0007* (2013.01); *B60R 16/02* (2013.01); *H05K 1/0216* (2013.01); *H05K 1/14* (2013.01);
(Continued)

(58) Field of Classification Search
CPC ........ H05K 1/0216; H05K 1/14; H05K 1/181; H05K 3/34; H05K 5/04; H05K 7/1427; H05K 9/0007; H05K 2201/0707
(Continued)

(56) References Cited

U.S. PATENT DOCUMENTS 6,781,847 B2 *  8/2004  Jakob .................. H05K 5/0069
                                                                                174/387
6,972,967 B2 * 12/2005  Norte .................. H05K 9/0067
                                                                                174/32
(Continued)

FOREIGN PATENT DOCUMENTS

DE         4300342 A1    7/1994
DE    102008040156 A1    1/2010
(Continued)

OTHER PUBLICATIONS

International Search Report dated Nov. 4, 2015, of the corresponding International Application PCT/EP2015/060174 dated May 8, 2015.

*Primary Examiner* — Hung S. Bui
(74) *Attorney, Agent, or Firm* — Norton Rose Fulbright US LLP; Gerard Messina

(57) ABSTRACT

An apparatus for activating a personal protection arrangement for a vehicle, including a housing, at least one circuit board, and at least one electrical or electronic component, the circuit board having at least one layer for shielding electromagnetic radiation, the circuit board being positioned in the housing in such a way that when the apparatus is
(Continued)

mounted in the vehicle, the circuit board shields the electromagnetic radiation that is emitted by the at least one electrical or electronic component at least with respect to the interior of the vehicle. And to a method for manufacturing such an apparatus.

10 Claims, 2 Drawing Sheets

(51) Int. Cl.
*B60R 16/02* (2006.01)
*H05K 1/02* (2006.01)
*H05K 1/14* (2006.01)
*H05K 1/18* (2006.01)
*H05K 3/34* (2006.01)
*H05K 5/04* (2006.01)
*H05K 7/14* (2006.01)

(52) U.S. Cl.
CPC ............. *H05K 1/181* (2013.01); *H05K 3/34* (2013.01); *H05K 5/0078* (2013.01); *H05K 5/04* (2013.01); *H05K 7/1427* (2013.01); *H05K 9/0039* (2013.01); *H05K 2201/0707* (2013.01)

(58) Field of Classification Search
USPC .......................................... 361/799, 816, 818
See application file for complete search history.

(56) References Cited

U.S. PATENT DOCUMENTS

| 7,088,592 | B2* | 8/2006 | Su ...................... G11B 33/1493 361/752 |
| 8,004,854 | B2* | 8/2011 | Kucharski ............ H05K 1/0216 361/780 |
| 8,619,429 | B2 | 12/2013 | Moser et al. |
| 9,820,394 | B2* | 11/2017 | Suzuki ................. H05K 5/0069 |
| 2011/0316641 | A1* | 12/2011 | Tsai ......................... H04B 3/28 333/12 |
| 2015/0029682 | A1* | 1/2015 | Kadoya ................ H05K 9/0039 361/748 |

FOREIGN PATENT DOCUMENTS

| JP | 2000294973 A | 10/2000 |
| JP | 2012005244 A | 1/2012 |
| WO | 2013/140884 A1 | 9/2013 |
| WO | 2013129982 A1 | 9/2013 |
| WO | 2014/069644 A1 | 5/2014 |

* cited by examiner

DEVICE FOR CONTROLLING PERSONAL PROTECTION MEANS AND METHOD FOR PRODUCING A DEVICE FOR CONTROLLING PERSONAL PROTECTION MEANS

FIELD OF THE INVENTION

The present invention relates to an apparatus for activating a personal protection arrangement for a vehicle, and to a method for manufacturing such an apparatus for activating a restraint arrangement for a vehicle.

BACKGROUND INFORMATION

Apparatuses for activating personal protection arrangements for vehicles may encompass electrical and electronic components from which electromagnetic radiation is emitted during operation; this can result in malfunctions in other electrical devices in the vehicle or in radio reception.

All electrical and electronic devices that are installed in a vehicle therefore will and must exhibit so-called "electromagnetic compatibility" (EMC).

One current possibility for improving the EMC of a device is to shield components that radiate particularly strongly from the other electrical or electronic devices using so-called "shielding panels."

The use of shielding panels is associated with additional costs and additional space in the housing of a control device.

SUMMARY OF THE INVENTION

The present invention would like to take this circumstance into account. An apparatus for activating a personal protection arrangement for a vehicle is therefore proposed, which apparatus possesses a high level of EMC and dispenses with additional shielding panels.

This is achieved by way of an apparatus as described herein, according to which the apparatus has a housing, at least one circuit board, and at least one electrical or electronic component, the circuit board having at least one layer for shielding electromagnetic radiation, the circuit board being positioned in the housing in such a way that when the apparatus is mounted in the vehicle, the circuit board shields the electromagnetic radiation that is emitted by the at least one electrical or electronic component at least with respect to the interior of the vehicle.

An "apparatus for activating a personal protection arrangement for a vehicle" is understood in the present instance as an airbag control device. An airbag control device typically receives, via sensors, information regarding an accident event, and triggers a personal protection arrangement as a function of the evaluation of that information. It can also be understood, however, to mean other control devices that are suitable, alone or as a combination control device, for triggering a personal protection arrangement for a vehicle.

"Personal protection means or arrangement for a vehicle" are understood as all means or arrangement that are suitable for minimizing consequences for persons sitting in or on the vehicle, and optionally third parties, in the event of an accident or near-accident. These include at least all types of airbags, belt tensioners, headrests, seat functions, engine hood functions.

A "housing" can be understood in the present instance as a container that is suitable for receiving components of the apparatus and making them accessible via mechanical or electrical interfaces. Typically the housing of a control device is also used to mount the control device in a motor vehicle at its intended location.

A "circuit board" is understood in the present instance as a board for receiving electrical or electronic components.

An "interior" of the vehicle is understood in the present instance as the space that is formed by the bodywork of the vehicle.

It is favorable in this context if the at least one electrical or electronic component is positioned on the circuit board, in particular on the sides (underside) of the circuit board facing away from the vehicle interior. The shielding action of the circuit board can thereby be particularly effective.

Up converters or down converters are components that furnish an input voltage of a specific magnitude at an output voltage having a greater or lesser magnitude with reference to the input voltage. These components typically encompass a converter choke. As a result they have a particularly high or significant potential for electromagnetic radiation, and they thus represent a particularly strong radiation source of the apparatus according to the present invention. It is therefore advantageous if the at least one electrical or electronic component of the apparatus according to the present invention is an up converter or down converter, since a particularly large proportion of the electromagnetic radiation sources of the apparatus are shielded because of the positioning according to the present invention of the component.

In an advantageous embodiment, the housing of the apparatus is configured in such a way that the housing shields electromagnetic radiation. The shielding effect of the apparatus is advantageously reinforced by this configuration of the invention, since the housing also contributes to shielding.

It is even more advantageous if the housing is made at least partly of metal, in particular of sheet metal. A housing made of metal intensifies the shielding effect of the shielding housing. If the housing is made of sheet metal, the housing then has an advantageously low weight.

It is also conceivable in this context to use a housing that is made entirely or partly of plastic, the plastic having a sufficiently large number of metal particles added to it and thereby generating the desired shielding effect.

An apparatus as recited herein, the at least one layer of the circuit board being configured in such a way that an electrical connection to an electrical ground potential is creatable via the layer. A layer of the circuit board which is configured in this manner is also called a "ground plane." Electronic and electrical components can thereby be connected to a ground potential. Potential differences can thereby advantageously be prevented. At the same time, the grounding layer advantageously provides a shielding effect in a circuit that otherwise acts in insulating fashion.

The method for manufacturing such an apparatus plays a particular role in this context.

In accordance therewith, an apparatus having the properties described above is produced when it is manufactured using the manufacturing method in accordance with the independent Claim 7.

As recited therein, a circuit board is positioned in a housing of the apparatus in such a way that the circuit board shields the electromagnetic radiation of at least one electrical or electronic component of the apparatus positioned in the housing at least with respect to the interior of the vehicle, when the apparatus is mounted in the vehicle.

Advantageous embodiments of the apparatus according to the present invention and of the method according to the present invention are evident from the dependent claims and from the description below of the exemplary embodiments.

It is advantageous if the at least one electrical or electronic component is positioned on the circuit board, in particular on the sides (underside) of the circuit facing away from the vehicle interior, before the circuit board is positioned in the housing of the apparatus. This ensures that the at least one electrical component is positioned in the housing of the apparatus in such a way that the positioning according to the present invention of the circuit board and housing results in shielding of the electromagnetic radiation of the electrical or electronic component, and thus in improved EMC for the apparatus.

Because the apparatus according to the present invention is exposed to impacts and vibrations in the vehicle, an intermaterial connection of the at least one electrical or electronic component to the circuit board has proven to be advantageous for the cohesion of the join. A variety of methods are available for intermaterial connection. Soldering, which may include reflow soldering, has proven successful with regard to the materials typically used.

"Reflow soldering" is understood in the present case to mean that in a first step solder is applied onto the circuit board; in a subsequent step the components to be soldered on are positioned on the circuit board, i.e. populated; and in a third step the solder is melted, so that after cooling an intermaterial connection occurs between the components and the circuit board.

It is particularly advantageous if the electrical or electronic component is connected to the circuit board by reflow soldering, and the electrical or electronic component is positioned on that side of the circuit board which is processed first. Circuit boards of apparatuses for activating a personal protection arrangement are typically populated on both sides. Typically, the underside of the circuit board is the first to be populated with electrical or electronic components and connected thereto. In a second step, the upper side of the circuit is then populated with electrical or electronic components and connected thereto.

Advantageous embodiments of the invention are depicted in the drawings and will be described below. In the drawings, identical reference characters refer to components or elements that perform identical or analogous functions.

DETAILED DESCRIPTION

Figure 1:
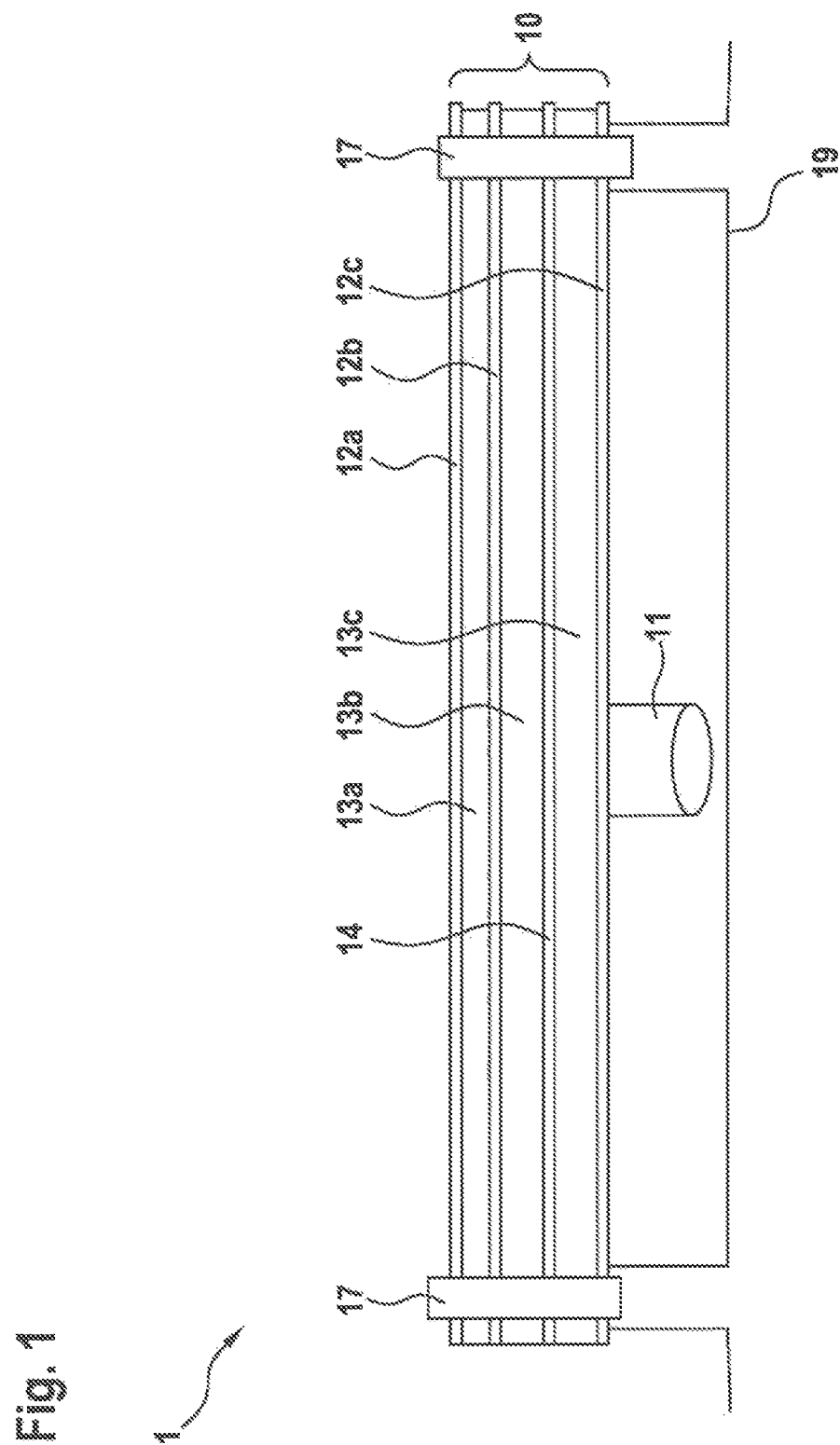
FIG. 1 shows a schematic side view of the apparatus according to the present invention.

FIG. 1 is a schematic side view of the apparatus according to the present invention.

Apparatus 1 according to the present invention, for example a control device for activating a personal protection arrangement, has a housing. This housing is typically made up of a cover (not depicted) and a bottom plate 19. The cover and bottom plate 19 constitute the space in which, typically, a circuit board 10 is positioned.

Circuit boards 10 are typically constructed in planes. The electrical and electronic components with which circuit board 10 is populated, and which provide the functionality of apparatus 1, are connected to one another via wiring planes 12*a*, 12*b*, 12*c*. A ground potential is made available via ground plane 14. The various planes are separated from one another by insulating layers 13*a*, 13*b*, 13*c*.

Circuit boards 10 are typically connected to the housing, or at least to a part of the housing, here to bottom plate 19, via a connecting arrangement 17. These connecting arrangements are typically screws. Bolts or the like can just as easily be used, however.

Typically, at least one of the connecting arrangements ensures an electrical connection of ground plane 14 to the housing (here to bottom plate 19). Because connecting arrangement 17 is often also used to fasten the housing in the vehicle at its intended location, the at least one connecting arrangement is used to create an electrical connection to the vehicle.

As depicted in FIG. 1, electrical or electronic component 11 that radiates particularly strongly is positioned on the underside of circuit board 10. The "underside" is defined in the present case to mean that side of circuit board 10 which faces away from the interior of the vehicle when apparatus 1 according to the present invention, here the control device, is mounted at its intended location in the vehicle.

As depicted in FIG. 1, electrical or electronic component 11 (here the up converter or down converter, or the converter choke of the up converter or down converter) is positioned on the underside of circuit board 10. Circuit board 10, or ground plane 14 positioned in the circuit board, thus performs its shielding function and thus ensures that apparatus 1 according to the present invention has greater electromagnetic compatibility (EMC).

Figure 2:
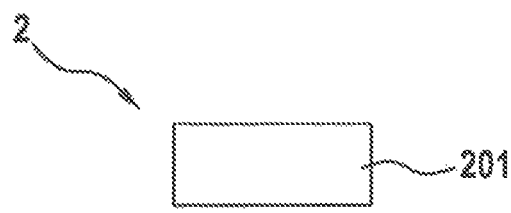
FIG. 2 shows a flow chart of the method according to the present invention.

FIG. 2 is the flow chart of the method for manufacturing the apparatus according to the present invention for activating a personal protection arrangement.

Step 201 represents the positioning of the circuit board in a housing of the apparatus in such a way that the circuit board shields the electromagnetic radiation of at least one electrical or electronic component of the apparatus, positioned in the housing, at least with respect to the interior of the vehicle, when the apparatus is mounted in the vehicle.

The circuit board can be positioned in the housing in a preparatory step. This means that the housing and the circuit board of the apparatus are pre-connected. Such pre-connection can be accomplished using detachable and nondetachable connecting methods such as screws, rivets, clips, or plugs. Final connection of the housing and the circuit board is then accomplished when the apparatus is positioned at the intended location in the vehicle.

Alternatively, the housing and the circuit board of the apparatus can be definitively connected to one another, and positioning of the apparatus in the vehicle occurs using a separate connecting arrangement in a separate step.

What is claimed is:

1. An apparatus for activating a personal protection arrangement for a vehicle, comprising:
   a housing;
   at least one circuit board having a top side and an underside, the underside of the circuit board being a side of the circuit board that is opposite to the top side of the circuit board; and
   at least one electrical or electronic component reflow soldered to the underside of the circuit board, wherein the at least one electrical or electronic component includes at least one of: (i) at least one of an up converter and a down converter; and (ii) a converter choke of at least one of an up converter and a down converter;
   wherein the circuit board has at least one layer for shielding electromagnetic radiation, the circuit board being positioned in the housing so that when the apparatus is mounted in the vehicle, the underside of the circuit board faces away from an interior of the vehicle, the circuit board shielding the electromagnetic radiation that is emitted by the at least one electrical or electronic component at least with respect to the interior of the vehicle.

2. The apparatus of claim 1, wherein the housing is configured so that the housing shields electromagnetic radiation.

3. The apparatus of claim 2, wherein the housing is made at least partly of metal.

4. The apparatus of claim 2, wherein the housing is made at least partly of sheet metal.

5. The apparatus of claim 1, wherein the at least one layer of the circuit board is configured so that an electrical connection to an electrical ground potential is creatable via the layer.

6. A method for manufacturing an apparatus for activating a restraint arrangement for a vehicle, the method comprising:
provided a circuit board having at least one layer for shielding electromagnetic radiation, the circuit board having a top side and an underside, the underside of the circuit board being a side of the circuit board that is opposite to the top side of the circuit board;
reflow soldering at least one electrical or electronic component to the underside of the circuit board, the electrical or electronic component including at least one of: (i) at least one of an up converter and a down converter; and (ii) a converter choke of at least one of an up converter and a down converter;
positioning the circuit board in a housing of the apparatus so when the apparatus is mounted in the vehicle, the underside of the circuit board faces away from an interior of the vehicle, and the circuit board shields the electromagnetic radiation of at least one electrical or electronic component of the apparatus located in the housing at least with respect to the interior of the vehicle.

7. The method of claim 6, wherein the housing is configured so that the housing shields electromagnetic radiation.

8. The method of claim 7, wherein the housing is made at least partly of metal.

9. The method of claim 8, wherein the housing is made at least partly of sheet metal.

10. The method of claim 6, wherein the at least one layer of the circuit board is configured so that an electrical connection to an electrical ground potential is creatable via the layer.

* * * * *